US012235153B2

(12) United States Patent
    Tricas et al.

(10) Patent No.: US 12,235,153 B2
(45) Date of Patent: Feb. 25, 2025

(54) CONTROL SYSTEM FOR AN ACTIVE SHIELDING SCREEN

(71) Applicants: CENTRE NATIONAL DE LA RECHERCHE SCIENTIFIQUE, Paris (FR); UNIVERSITE DE RENNES, Rennes (FR); SAFRAN ELECTRONICS & DEFENSE, Paris (FR)

(72) Inventors: Quentin Tricas, Moissy-Cramayel (FR); Patrice Foutrel, Moissy-Cramayel (FR); Philippe Besnier, Paris (FR); Xavier Castel, Rennes (FR); Claire Le Paven, Rennes (FR)

(73) Assignees: CENTRE NATIONAL DE LA RECHERCHE SCIENTIFIQUE, Paris (FR); UNIVERSITE DE RENNES, Rennes (FR); SAFRAN ELECTRONICS & DEFENSE, Paris (FR)

( * ) Notice: Subject to any disclaimer, the term of this patent is extended or adjusted under 35 U.S.C. 154(b) by 0 days.

(21) Appl. No.: 18/281,218

(22) PCT Filed: Feb. 16, 2022

(86) PCT No.: PCT/FR2022/050284
    § 371 (c)(1),
    (2) Date: Sep. 8, 2023

(87) PCT Pub. No.: WO2022/189717
    PCT Pub. Date: Sep. 15, 2022

(65) Prior Publication Data
    US 2024/0151577 A1     May 9, 2024

(30) Foreign Application Priority Data
    Mar. 11, 2021 (FR) ...................... 2102339

(51) Int. Cl.
    *G01J 1/02*     (2006.01)
    *H05K 9/00*     (2006.01)

(52) U.S. Cl.
    CPC .............. *G01J 1/02* (2013.01); *H05K 9/0058* (2013.01); *H05K 9/0064* (2013.01); *H05K 9/0071* (2013.01); *G01J 2001/0276* (2013.01)

(58) Field of Classification Search
    CPC .. G01J 1/02; G01J 2001/0276; H05K 9/0058; H05K 9/0064; H05K 9/0071
    See application file for complete search history.

(56) References Cited

U.S. PATENT DOCUMENTS

| 2011/0115686 | A1  | 5/2011 | Hauhe et al. |
| 2020/0173859 | A1* | 6/2020 | Dupeyrat .............. H01L 23/552 |

FOREIGN PATENT DOCUMENTS

WO     WO 2018/215243 A1     11/2018

OTHER PUBLICATIONS

International Patent Application No. PCT/FR2022/050284, International Search Report dated Jun. 15, 2022 with English translation, 7 pages.

(Continued)

*Primary Examiner* — Tony Ko
(74) *Attorney, Agent, or Firm* — Cozen O'Connor

(57) ABSTRACT

A system for controlling the activation/deactivation of an electromagnetic shielding screen of a porthole or a protective window of an optoelectronic equipment, which includes, a radiofrequency electromagnetic sensor, with a bandwidth adapted to a cut-off band of said shielding screen corresponding to a range of electromagnetic fields to be blocked, connected to a detector-rectifier with a sensitivity higher than a minimum value of the power of an electromagnetic field to be blocked by means of said shielding screen and a device for activating/deactivating said electro- (Continued)

magnetic shielding screen, said detector-rectifier being configured, in the presence of the electromagnetic field with a power exceeding said minimum value, to activate said device for activating/deactivating the electromagnetic shielding screen by capturing the electromagnetic energy supplied by said electromagnetic fields with a power exceeding said minimum value.

20 Claims, 2 Drawing Sheets

(56) References Cited

OTHER PUBLICATIONS

Natural Resources Canada, Canada Centre for Remote Sensing "Fundamentals of Remote Sensing", Aug. 3, 2007, 258 pages.
Mehmood et al., "RF and microwave power detection with Schottky diodes", Infineon Technologies AG, Jul. 31, 2018, 15 pages.
Takacs et al., "Ultra-compact Ku band rectenna", 2015 IEEE Mtt-S International Microwave Symposium, IEEE, May 17, 2015, 4 pages.

* cited by examiner

CONTROL SYSTEM FOR AN ACTIVE SHIELDING SCREEN

CROSS-REFERENCE TO RELATED APPLICATIONS

This application is a US National phase Application of International Patent Application No. PCT/FR2022/050284 filed Feb. 16, 2022, which claims priority to FR No. 2102339 filed Mar. 11, 2021, both of which are hereby incorporated in their entireties.

TECHNICAL FIELD

The present description relates to the field of active electromagnetic shielding provided with a treatment for protection against electromagnetic waves for portholes and optics that can be used on optronic equipment. It provides a system for controlling the activation/deactivation of an electromagnetic shielding screen directly controlled by the detection of an electromagnetic radiation to be attenuated.

PRIOR ART

In general, optical detection systems are placed behind portholes or protective windows. It is necessary to protect optical vision devices such as optical detection sensors and their electronic circuits, for example sensors sensitive to optical radiations in the visible and/or infrared range, the operation of which might be disturbed by electromagnetic radiations, in particular in the microwave range.

Indeed, microwave radiations could interact with electronic circuits that should be placed immediately proximate to the sensors and which cannot be shifted in volumes protected against microwave radiations originating from the outside.

It is known to place on the porthole or the window, in front of an optical sensor, a shielding element which is at least partially opaque for part of the microwave radiations, while being at least partially transparent for the optical radiations. For this purpose, the shielding element generally includes at least one two-dimensional structure such as a mesh of metal tracks which is electrically conductive in the microwave frequency range, while being at least partially transparent to optical radiations.

To ensure an effective protection against microwave radiations, the two-dimensional structure forming the conductive shielding in the microwave range should also be electrically connected to at least one portion of a shell which is also electrically conductive, and which surrounds the sensor(s) to be protected. This shell itself could be electrically connected to the electrical ground of a carrier support or vehicle on which the optical sensor(s) are installed, or else connected to an electrical reference. All of these connections should have a low electrical impedance in the microwave range to ensure the desired protection.

Nonetheless, in some cases it is desirable to be able to include with optical sensor systems, microwave radiation sensor systems which require the shielding to remain transparent to microwaves in a given electromagnetic energy range while producing enough shielding effectiveness to higher energy levels.

This is also necessary when the system to be protected itself emits a microwave radiation which might disturb its own operation if these radiations are not able to propagate outwards.

It is then known to make adaptive shielding whose effectiveness is increased in the presence of microwave radiations with high electromagnetic energy.

In particular, the document WO2018/215243 suggests a shielding screen with a micrometric metal mesh directly printed over the inner faces of optics or of portholes of different optronic equipment. This micrometric metal mesh is defined by the width of its constituent metal strips, its mesh pitch or period and the metallisation thickness used. The modulation of the shielding effectiveness for its switch from the active state (ON state) into the inactive state (OFF state) and vice versa is obtained by controlling the value of the electrical contact resistance between the metal mesh and the ground return of the shielding screen. This control is carried out, either by setting up localised electronic components (PIN diodes, MEMS, NEMS, etc.) between the micrometric metal mesh and the ground return, or by using printed tapes based on metal/insulator transition materials which are typically heat-activable and electro-activable materials. These devices include an electrically-conductive state (ON state) and an insulating state (OFF state) or modulate the value of the contact resistance, and consequently, the value of the shielding effectiveness of the screen, and that being so in a completely reversible manner.

TECHNICAL PROBLEM

In current devices, the switch of the shielding screen from the OFF state into the ON state and vice versa is carried out by the action of a human operator and an external energy source. For example, the operator could cut off or impose the circulation of the DC current powering the control electronic components of the shielding. Yet, there are situations where it is desired that the shielding be able to automatically switch from a transparent state into a blocking state for electromagnetic waves, in particular microwaves.

SUMMARY

An objective of the present invention is to provide shielding assemblies which are adapted to automatically switch from an inactive mode into an active mode and vice versa according to the intensity of a microwave radiation to address situations in which the microwave radiation becomes too high or remains compatible with a radiation measurement.

To do so, the present invention proposes a system for controlling the activation/deactivation of an electromagnetic shielding screen provided with an activation/deactivation device for a porthole or a protective window of an optoelectronic equipment, which includes an electromagnetic sensor for receiving a radiofrequency electromagnetic field, with a bandwidth adapted to a cut-off band of said shielding screen corresponding to a range of electromagnetic fields to be blocked, connected to a detector-rectifier with a sensitivity higher than a minimum value of the power of an electromagnetic field to be blocked by means of said electromagnetic shielding screen, said electromagnetic sensor and detector-rectifier being configured, in the presence of the electromagnetic field with a power exceeding said minimum value, to activate said device for activating/deactivating the electromagnetic shielding screen by capturing the electromagnetic energy supplied by said electromagnetic field with a power exceeding said minimum value.

Thus, the invention takes advantage of the energy of the incident electromagnetic field to drive the adaptive shielding screen.

The activation/deactivation device being a PIN diode (standing for Positive Intrinsic Negative diode) device, said detector-rectifier may supply, directly from the electromagnetic energy of the output signal of said detector-rectifier, a supply voltage or current of the pin diode device necessary to activate said electromagnetic shielding screen.

In this configuration, no electric power supply of the system is necessary.

The radiofrequency electromagnetic sensor may be an antenna sized to sense an electromagnetic energy adapted to enable said detector-rectifier device to directly produce a supply voltage or current of said activation/deactivation device necessary to activate said shielding for an electromagnetic field power value to be blocked higher than a setpoint value. The sizing of the antenna will then achieve a threshold function for the shielding to operate.

The shielding screen may be connected to a collector structure, in particular an electrically-conductive frame of the shielding connected to the ground, throughout a network including a plurality of parallel links, each link including a capacitor and a PIN diode in series, the detector-rectifier making, in the presence of said electromagnetic field with a power exceeding said minimum value, a direct voltage source for electrically polarising said PIN diodes connected to the anodes PIN diodes throughout resistors, the cathodes of said PIN diodes being connected to the collector structure.

The activation/deactivation device may be a PIN diode device between the shielding screen and a frame of the shielding screen or an array with insulator/metal transition material tracks, for example $VO_2$ or a pump system for injecting a liquid with high dielectric permittivity and/or electrically conductive within a peripheral channel between the structure of the electromagnetic shielding screen and its frame connected to the ground, which may include in this case an amplification stage interposed between the detector/rectifier device and the said PIN diode device, said array with insulator/metal transition material tracks or said pump system of said electromagnetic shielding screen. This allows controlling/activating devices requiring a higher electric power supply or activating devices with an incident wave with a lower power.

According to a particular embodiment, a comparator may be arranged at the output of the detector-rectifier to drive said amplifier, which allows defining an activation threshold.

The amplification stage(s) may be powered by a voltage or current source external to said optoelectronic equipment or be powered by a current source.

The incident electromagnetic signal being a pulse-modulated signal, the detector-rectifier may be configured to have a decay time constant of the detection signal higher than the inverse of a repetition frequency of the incident electromagnetic signal so as to keep the control signal active between the repetitions of said electromagnetic signal.

The detector-rectifier may include or consist of a Schottky diode RF detector.

The invention applies to an active shielding screen, for a porthole or a protective window of electronic equipment, including an electrically-conductive two-dimensional structure in the microwave frequency domain, being at least partially transparent to optical radiation and including an activation/deactivation device adapted to activate said shielding by connecting said structure to an electrical ground of a support, which includes a control system according to the invention.

BRIEF DESCRIPTION OF THE DRAWINGS

Other features, details and advantages will appear upon reading the detailed description hereinafter, and upon analysing the appended drawings, wherein.

DESCRIPTION OF THE EMBODIMENTS

Figure 1:
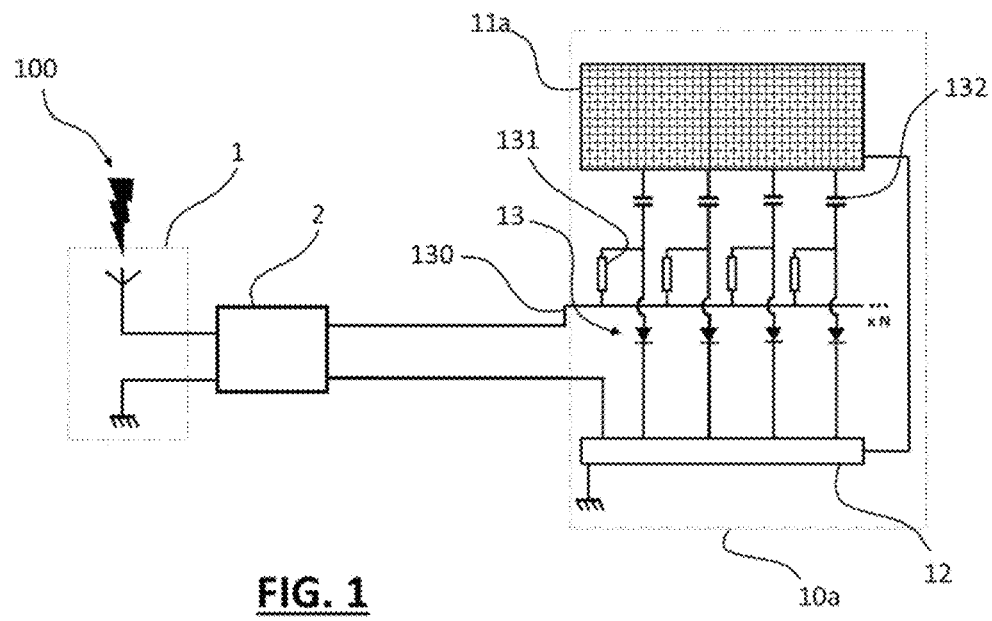
FIG. 1 shows a diagram of the control of an adaptive shielding mesh screen controlled by PIN diodes.

The present invention relates to active shielding screens, switching from an electromagnetically-transparent state (OFF state) into an attenuation or blocking state (ON state) in a standalone manner, without any intervention of a human action, and that being so as of the apparition of a microwave electromagnetic field with an intensity higher than a limit value in a frequency band to be attenuated, thereby making the shielding screen "smart". The electromagnetic fields concerned by the invention are electromagnetic fields, for example with a frequency comprised between 0.1 GHz (gigahertz) and 40 GHz and in particular generated by pulse-modulated microwave signals.

Such shielding screens or shielding include a metallic mesh $11a$, $11b$, $11c$, $11d$ such as a metallic mesh with a micrometric pitch printed on an electromagnetically and optically transparent substrate of a porthole or a window, which when the shielding is activated will be connected to the ground, for example throughout an electrically-conductive frame itself grounded.

The device object of the invention is based on a radiofrequency RF electromagnetic sensor 1, which may be located outside the area protected by the electromagnetic shielding. This sensor, whose bandwidth is adapted to the electromagnetic constraint, is associated with a detector whose time constant is also adapted to the waveform of the incident signal which is most often pulse-modulated. The detector acts as a rectifier, itself connected where necessary to an electronic amplifier. The whole is connected to the device for grounding the shielding.

In the electromagnetic constraint phase, the RF sensor is sensitive to this constraint and an RF current is generated therewithin. Afterwards, the RF current is detected and transformed into direct current by the detector-rectifier. If the energy of the electromagnetic stress is high enough to activate the device for varying the shielding effectiveness of the shielding screen, no power supply source besides the energy of the incident signal has to be supplied to the system, for example by means of a device for amplifying the signal. Otherwise, it will be associated with the device to be protected.

The embodiments of the devices described hereinbelow implement a shielding screen whose shielding effectiveness (SE) could be modified automatically in a reversible manner according to two states: ON state for which the shielding effectiveness is maximum when the equipment is subjected to an external electromagnetic constraint; OFF state for which the shielding effectiveness is minimum when the equipment is not subjected to an electromagnetic constraint. In addition, this screen should keep optimal optical transparency at all times, for example in the UV, visible and IR domains, in accordance with the operating spectra of the different sensors protected thereby. Moreover, off the EM constraint phase, a high shielding effectiveness is superfluous because (1) it limits the detection powers of the electromagnetic wave sensors and (2) it could even disturb the proper operation of all sensors by a phenomenon of self-disturbance of the system when the electromagnetic waves generated by said system remain confined within the structure or the carrier vehicle.

Figure 2:
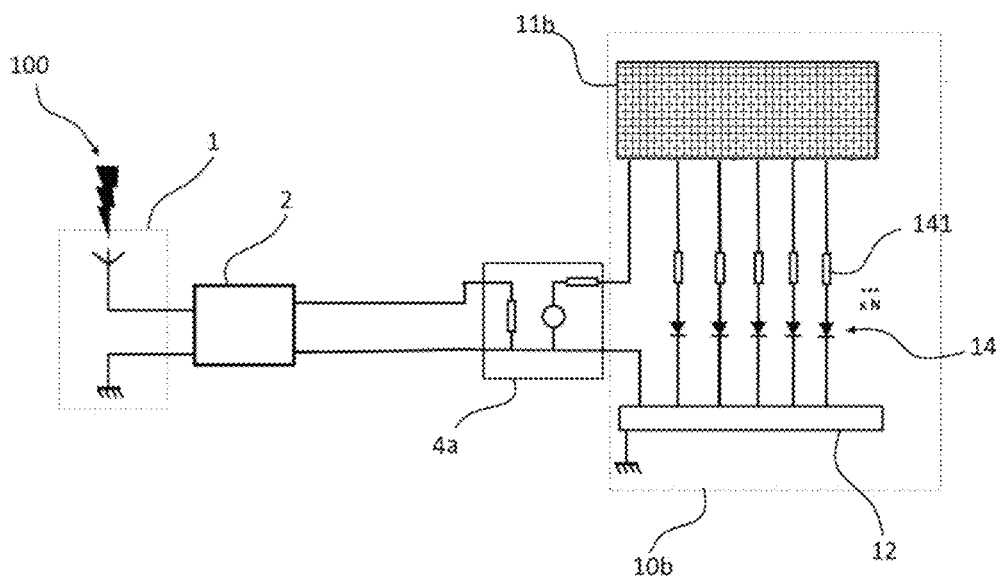
FIG. 2 shows a diagram of the control of an adaptive shielding polarised-mesh screen.
Figure 3:
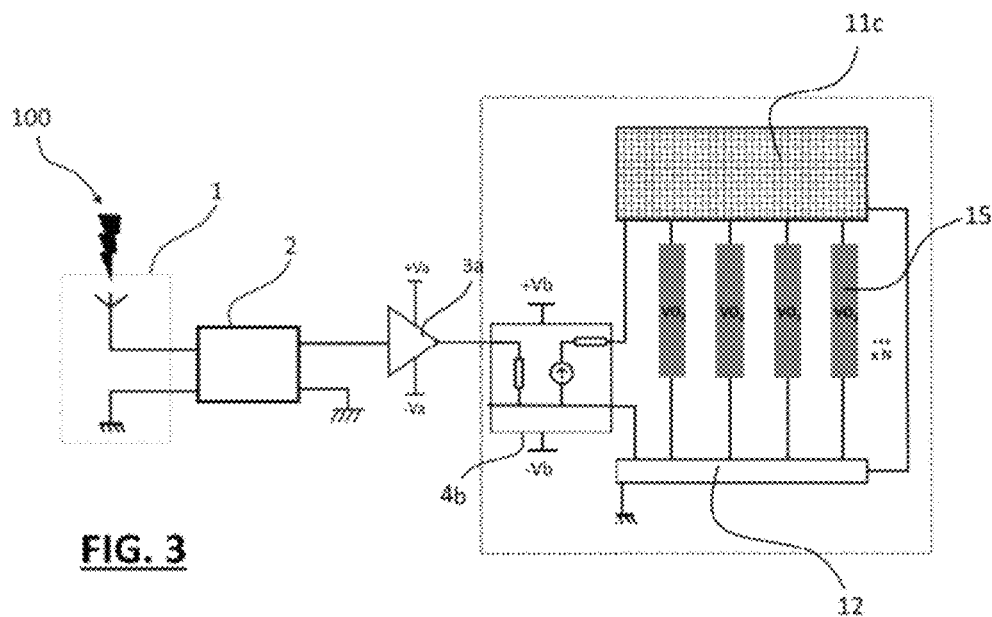
FIG. 3 shows a diagram of the control of an adaptive shielding screen with printed tapes based on metal/insulator transition materials, for example $VO_2$.
Figure 4:
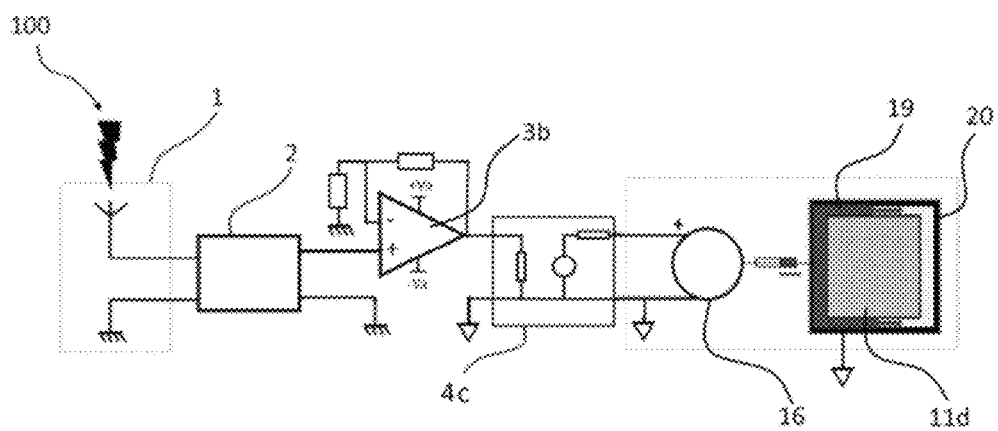
FIG. 4 shows a diagram of the control of an adaptive shielding screen with a microfluidic pump.

According to FIGS. 1 to 4, the electromagnetic shielding power supply devices are:
- conductive tracks grounded throughout the polarised PIN diodes in the case of FIG. 1;
- a polarisation of the mesh and an array of ground return PIN diodes in the case of FIG. 2;
- an electric or thermal power supply system for switching a metal/insulator transition material, for example $VO_2$ according to FIG. 3;
- an electric power supply system 16 of one or more pump(s) in FIG. 4.

The device for detecting the electromagnetic wave to be blocked includes a detector based on a radiofrequency RF electromagnetic sensor 1, which may be located outside the area protected by the electromagnetic shielding screen. This sensor, which behaves like an antenna, has a bandwidth adapted to the electromagnetic constraint to which the carrier system or vehicle equipped with sensors to be protected will be exposed. This sensor is associated with a detector-rectifier 2 whose time constant is also adapted to the waveform of the incident signal most often pulse-modulated.

In the electromagnetic constraint phase, the RF sensor is sensitive to this constraint and an RF current is generated therewithin. Afterwards, the RF current is detected and transformed into DC current by the detector-rectifier 2, for example a Schottky diode detector-rectifier according to the received power.

Several configurations are possible depending on the energy of the electromagnetic disturbance 100 to be attenuated or the required voltage to activate the control and/or power supply device of the adaptive shielding screen 11a, 11b, 11c, 11d.

For the case of FIG. 1, the shielding screen 11a is connected to a collector structure 12, for example an electrically-conductive frame of the shielding connected to ground, throughout a network including a plurality of parallel links, each link including a capacitor 132 and a PIN diode 13. The detector-rectifier 2 forms a DC voltage source connected to the anodes of the PIN diodes 13 throughout resistors 131 to electrically polarise these diodes whose cathodes are connected to the collector structure. This polarisation enables the conduction of the PIN diodes 13, which is effective for an alternating current at a frequency comprised between 0.1 GHz and 40 GHz, called microwave current. The microwave current which flows through the diodes 13 is generated by the microwave radiation 100 which is incident on the gate 11a of the two-dimensional shielding structure. To make a high-pass filter, decoupling capacitors 132 are inserted between the screen 11a and the anodes of the PIN diodes 13.

When the control of the adaptive shielding screen consists of a polarisation as in the case of FIG. 1, the output of the detector-rectifier is directly connected to the array of PIN diodes 13 to be polarised throughout resistors 131. In this case, the diodes having become conductive, the energy of the high-frequency electromagnetic wave received by the shielding screen 11a is evacuated throughout the capacitors 132 and the PIN diodes 13 towards the grounded frame 12. This passive system avoids the need for an electric power supply for the shielding screen and the detection device.

For example, to do without an amplification stage in such a case, by using an antenna and an RF detector of the 33330C type from the Keysight company whose output impedance is about 1.3 KOhm, to power an array of PIN diodes, at least one potential difference in DC in the range of 13 Volt should be generated in order to generate a current of 10 mA in order to polarise the PIN diodes. To do so, the receiver antenna should collect 26 mW (ideally 10 mW) knowing that the detector delivers 0.5 mV DC per microwatt of RF power. This corresponds approximately to an incident field in the range of 1,000 V/m (for an isotropic receiver antenna). This is typically the order of magnitude of some operational situations known in standardised terms as "High Intensity Radiated field".

Nonetheless, the developed system could evolve and merely an example thereof is herein disclosed (the selection of other detectors or making of an appropriate detector is possible for example).

The case of FIG. 2 is a case where the polarisation of the PIN diodes 14 is done directly by means of a polarisation of the shielding screen. In this example, an amplifier 4a is interposed between the detector-rectifier and the shielding screen and this amplifier includes a power supply which may be located outside the area to be protected.

Nonetheless, it should be noted that if the energy of the EM constraint is high enough to activate the device for varying the SE of the shielding screen directly by means of the current derived from the detector-rectifier, the amplifier could be not necessary like in the case of FIG. 1.

The automatic activation of the device for controlling the shielding effectiveness of the shielding screen by the conversion of the power of the incident electromagnetic wave or of the energy in the case of a repeated pulse, allows increasing the shielding effectiveness of said shielding screen (ON state).

In the case of FIG. 3, the energy of the EM constraint captured by the antenna is used in the context of a solution with insulator/metal transition material, for example $VO_2$, tracks. The detection device is intended to generate a potential difference at the edge of the tracks made of $VO_2$ in order to cause the insulator/metal transition of the material connecting the mesh 11c to its electrical ground boundary 12. This decreases the contact impedance between the mesh and the boundary, thereby increasing the shielding effectiveness of the adaptive shielding screen. An alternative solution is to use the detection device to power a heating device localised at the level of the $VO_2$ tracks, in order to cause the insulator/metal transition of the material connecting the mesh to its boundary.

This solution may, as shown, require an amplification stage 3a which will be powered by an intrinsic electrical source which may be located outside the area to be protected and by a power amplification stage 4b which may include a power supply located in the area to be protected by the shielding. A galvanic isolation may also be provided for between the components located outside the area protected by the shielding and the components located in the area protected by the shielding. Similarly, an EMC filtering may also be provided for at the entrance to the protected area.

FIG. 4 corresponds to an adaptive shielding device using one or more pumps 16 injecting a liquid with a high dielectric permittivity 19 and/or electrically conductive within a peripheral channel 19 between the electromagnetic shielding structure 11d and its frame connected to the ground which reduces the contact impedance between the mesh and the frame, thereby increasing the shielding effectiveness of the shielding screen. The energy of the electromagnetic constraint captured by the antenna will electrically power the pump(s) 16 throughout an amplifier 4c with enough electric power. In this example, a comparator 3b with a predefined threshold will allow selecting the electromagnetic energy level from which the adaptive shielding should be activated. Herein again, a galvanic isolation may also be provided for between the components located outside the area not protected by the shielding and the components located in the area protected by the shielding.

For solutions based on electronic components or a metal/insulator transition material, for example $VO_2$, the stoppage of the electromagnetic constraint leads to the stoppage of the power supply of the shielding effectiveness control device: the diodes become blocking again, or the $VO_2$ material becomes electrically-insulating again and therefore an automatic reduction in the shielding effectiveness of the shielding screen is obtained.

For the pump system, a purge of the liquid with high dielectric permittivity and/or electrically conductive by suction thereof via a depression, or by expulsion thereof through the injection of a pressurised gas should be carried out.

The device of the invention adapted more particularly to the protection of systems in the case of strong fields of several hundreds of V/m and to pulsed fields for example, with for example pulse trains in the range of ten to several hundred nanoseconds repeating with a period in the range of a microsecond, thus fills a triple role: detection of the EM constraint; generation of the electric power of the protection device; activation of the SE variation device of the shielding screen.

Thus, by capturing the electromagnetic energy supplied by a strong electromagnetic field, the device of the invention can automatically activate the ON state of the shielding screen, thereby making the shielding screen independent of any external energy source or allowing reducing the external energy needs. Such a self-adaptive control also enables the return to the OFF state as soon as the electromagnetic constraint is no longer detected for devices with PIN diode or a metal/insulator transition material.

The automatic activation of the device for controlling the shielding effectiveness of the shielding screen by the conversion of the energy of the incident electromagnetic wave allows increasing the shielding effectiveness of said shielding screen (ON state).

The invention claimed is:

1. A system for controlling the activation/deactivation of an electromagnetic shielding screen provided with an activation/deactivation device for a porthole or a protective window of an optoelectronic equipment, comprising:
    an electromagnetic sensor for receiving a radiofrequency electromagnetic field, with a bandwidth adapted to a cut-off band of said shielding screen corresponding to a range of electromagnetic fields to be blocked,
    a detector-rectifier connected to the electromagnetic sensor, with a sensitivity higher than a minimum value of the power of an electromagnetic field to be blocked by means of said electromagnetic shielding screen,
    said electromagnetic sensor and detector-rectifier being configured, in the presence of an electromagnetic field with a power exceeding said minimum value, for capturing the electromagnetic energy supplied by said electromagnetic field with a power exceeding said minimum value for powering and activating said activation/deactivation device for activating/deactivating the electromagnetic shielding screen using said electromagnetic energy supplied by said electromagnetic field with a power exceeding said minimum value.

2. The control system according to claim 1, wherein, the activation/deactivation device being a PIN diode device, said detector-rectifier converts electromagnetic energy captured by said detector-rectifier, into a supply voltage or current of the pin diode device necessary to activate said electromagnetic shielding screen.

3. The control system according to claim 2, wherein the radiofrequency electromagnetic sensor comprises an antenna sized to sense an electromagnetic energy adapted to enable said detector-rectifier device to directly produce a supply voltage or current of said activation/deactivation device necessary to activate said shielding for an electromagnetic field power value to be blocked higher than a setpoint value.

4. The control system according to claim 2, wherein the electromagnetic shielding screen is connected to a collector structure throughout a network including a plurality of parallel links, each link including a capacitor and a PIN diode in series, the detector-rectifier making, in the presence of said electromagnetic field with a power exceeding said minimum value, a direct voltage source for electrically polarising said PIN diodes connected to anodes of said PIN diodes throughout resistors, cathodes of said PIN diodes being connected to the collector structure.

5. The control system according to claim 4, wherein the collector structure is an electrically-conductive frame of the shield connected to a ground of said equipment.

6. The control system according to claim 1, wherein the activation/deactivation device is a PIN diode device between the shielding screen and a frame of the shielding screen or an array with insulator/metal transition material tracks, for example $VO_2$ or a pump system for injecting a liquid with high dielectric permittivity and/or electrically conductive within a peripheral channel between the structure of the electromagnetic shielding screen and its frame connected to the ground, and includes an amplification stage interposed between the detector-rectifier device and the said PIN diode device, said array with insulator/metal transition material tracks or said pump system of said electromagnetic shielding screen.

7. The control system according to claim 6, comprising a comparator at the output of the detector-rectifier drives said amplifier.

8. The control system according to claim 6, wherein said amplification stage is powered by a voltage or current source external to said optoelectronic equipment.

9. The control system according to claim 6, wherein said amplification stage is powered by a voltage or current source internal to said optoelectronic equipment.

10. The control system according to claim 1, wherein, the incident electromagnetic field being a pulse-modulated signal, said detector-rectifier is configured to have a decay time constant of the output signal higher than the inverse of a repetition frequency of the incident electromagnetic field so as to keep the control signal active between the repetitions of said electromagnetic field.

11. The control system according to claim 1, wherein said detector-rectifier comprises a Schottky diode RF detector.

12. An active shielding screen, for a porthole or a protective window of electronic equipment, including an electrically-conductive two-dimensional structure in the microwave frequency domain, being at least partially transparent to optical radiation and including an activation/deactivation device adapted to activate said shielding by connecting said structure to an electrical ground of a support, comprising a control system according to claim 1.

13. A system for controlling the activation/deactivation of an electromagnetic shielding screen provided with an activation/deactivation device for a porthole or a protective window of an optoelectronic equipment, comprising:
- an electromagnetic sensor for receiving a radiofrequency electromagnetic field, with a bandwidth adapted to a cut-off band of said shielding screen corresponding to a range of electromagnetic fields to be blocked,
- a detector-rectifier connected to the electromagnetic sensor, with a sensitivity higher than a minimum value of the power of an electromagnetic field to be blocked by means of said electromagnetic shielding screen,
- said electromagnetic sensor and detector-rectifier being configured, in the presence of the electromagnetic field with a power exceeding said minimum value, to activate said device (for activating/deactivating the electromagnetic shielding screen by capturing the electromagnetic energy supplied by said electromagnetic field with a power exceeding said minimum value and wherein, the activation/deactivation device being a PIN diode device, said detector-rectifier converts electromagnetic energy captured by said detector-rectifier into a supply voltage or current of the pin diode device necessary to activate said electromagnetic shielding screen.

14. The control system according to claim 13, wherein the radiofrequency electromagnetic sensor comprises an antenna sized to sense an electromagnetic energy adapted to enable said detector-rectifier device to directly produce a supply voltage or current of said activation/deactivation device necessary to activate said shielding for an electromagnetic field power value to be blocked higher than a setpoint value.

15. The control system according to claim 13, wherein the electromagnetic shielding screen is connected to a collector structure throughout a network including a plurality of parallel links, each link including a capacitor and a PIN diode in series, the detector-rectifier making, in the presence of said electromagnetic field with a power exceeding said minimum value, a direct voltage source for electrically polarising said PIN diodes connected to anodes of said PIN diodes throughout resistors, cathodes of said PIN diodes being connected to the collector structure.

16. The control system according to claim 15, wherein the collector structure is an electrically conductive frame of the shield connected to a ground of said equipment.

17. A system for controlling the activation/deactivation of an electromagnetic shielding screen provided with an activation/deactivation device for a porthole or a protective window of an optoelectronic equipment, comprising:
- an electromagnetic sensor for receiving a radiofrequency electromagnetic field, with a bandwidth adapted to a cut-off band of said shielding screen corresponding to a range of electromagnetic fields to be blocked,
- a detector-rectifier connected to the electromagnetic sensor, with a sensitivity higher than a minimum value of the power of an electromagnetic field to be blocked by means of said electromagnetic shielding screen,
- said electromagnetic sensor and detector-rectifier being configured, in the presence of the electromagnetic field with a power exceeding said minimum value, to activate said device for activating/deactivating the electromagnetic shielding screen by capturing the electromagnetic energy supplied by said electromagnetic field with a power exceeding said minimum value and wherein the activation/deactivation device is a PIN diode device between the shielding screen and a frame of the shielding screen or an array with insulator/metal transition material tracks, for example $VO_2$ or a pump system for injecting a liquid with high dielectric permittivity and/or electrically conductive within a peripheral channel between the structure of the electromagnetic shielding screen and its frame connected to the ground, and includes an amplification stage interposed between the detector-rectifier device and the said PIN diode device, said array with insulator/metal transition material tracks or said pump system of said electromagnetic shielding screen.

18. The control system according to claim 17, comprising a comparator at the output of the detector-rectifier drives said amplifier.

19. The control system according to claim 17, wherein said amplification stage is powered by a voltage or current source external to said optoelectronic equipment.

20. The control system according to claim 17, wherein said amplification stage is powered by a voltage or current source internal to said optoelectronic equipment.

* * * * *